(12) United States Patent
Lee

(10) Patent No.: US 11,626,354 B2
(45) Date of Patent: Apr. 11, 2023

(54) METHOD OF MANUFACTURING REDISTRIBUTION SUBSTRATE

(71) Applicant: SAMSUNG ELECTRONICS CO., LTD., Suwon-si (KR)

(72) Inventor: Seokhyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/341,510

(22) Filed: Jun. 8, 2021

(65) Prior Publication Data

US 2021/0296163 A1  Sep. 23, 2021

Related U.S. Application Data

(63) Continuation of application No. 16/676,716, filed on Nov. 7, 2019, now Pat. No. 11,075,149.

(30) Foreign Application Priority Data

Feb. 15, 2019 (KR) ........................ 10-2019-0017514

(51) Int. Cl.
*H01L 23/495* (2006.01)
*H01L 23/522* (2006.01)
*H01L 23/532* (2006.01)
*H01L 21/768* (2006.01)
*H01L 49/02* (2006.01)

(52) U.S. Cl.
CPC .. *H01L 23/49589* (2013.01); *H01L 21/76802* (2013.01); *H01L 21/76841* (2013.01); *H01L 23/5226* (2013.01); *H01L 23/53266* (2013.01); *H01L 28/40* (2013.01)

(58) Field of Classification Search
None
See application file for complete search history.

(56) References Cited

U.S. PATENT DOCUMENTS

| | | | |
|---|---|---|---|
| 5,466,629 A | 11/1995 | Mihara et al. |
| 6,027,980 A | 2/2000 | Gardner |
| 7,002,248 B2 | 2/2006 | Akram et al. |
| 8,124,490 B2 | 2/2012 | Lin et al. |
| 8,372,689 B2 | 2/2013 | Lee et al. |
| 9,324,780 B2 | 4/2016 | Jen et al. |
| 9,577,025 B2 | 2/2017 | Gu et al. |
| 9,704,796 B1 | 7/2017 | Gu et al. |
| 9,818,817 B2 | 11/2017 | Zhu et al. |

(Continued)

FOREIGN PATENT DOCUMENTS

| | | |
|---|---|---|
| JP | 2011-253944 A | 12/2011 |
| JP | 6096013 B2 | 3/2017 |

*Primary Examiner* — Bo B Jang
(74) *Attorney, Agent, or Firm* — Lee IP Law, P.C.

(57) ABSTRACT

A redistribution substrate includes a first conductive pattern including a first lower pad and a second lower pad, the first and second lower pads being within a first insulating layer, a second conductive pattern including a first upper pad and a second upper pad, the first and second upper pads being on the first insulating layer, a first via connecting the first lower pad and the first upper pad to each other in the first insulating layer, a second via connecting the second lower pad and the second upper pad to each other in the first insulating layer, and a capacitor between the first lower pad and the first via.

20 Claims, 16 Drawing Sheets

(56) References Cited

U.S. PATENT DOCUMENTS

| | | | |
|---|---|---|---|
| 2003/0235944 A1* | 12/2003 | Okita | H01L 28/60 |
| | | | 257/E21.011 |
| 2004/0238957 A1* | 12/2004 | Akram | H01L 23/49531 |
| | | | 257/E23.036 |
| 2008/0153245 A1 | 6/2008 | Lin et al. | |
| 2014/0264748 A1 | 9/2014 | Fujiwara et al. | |
| 2015/0221714 A1 | 8/2015 | Gu et al. | |

* cited by examiner

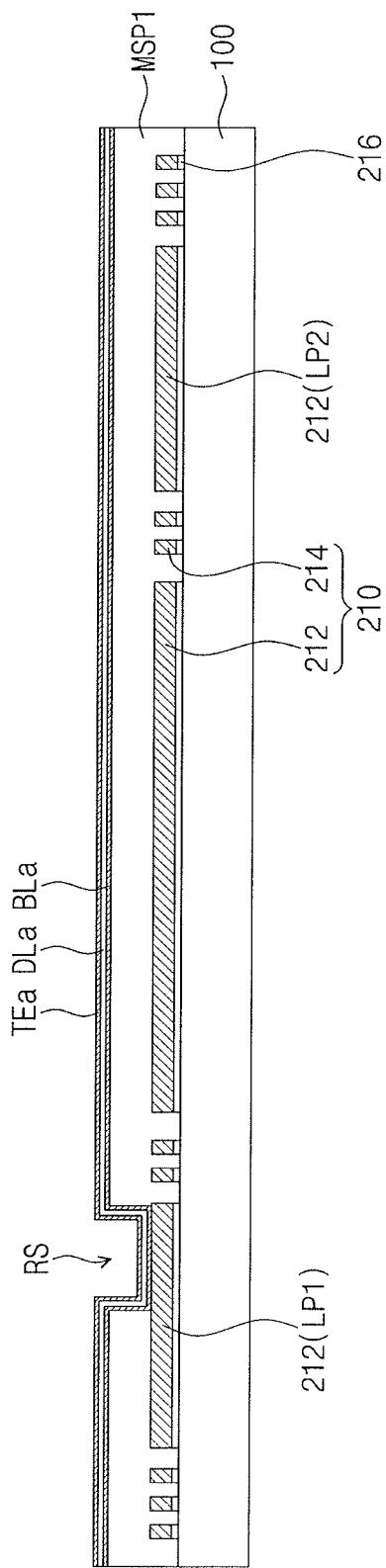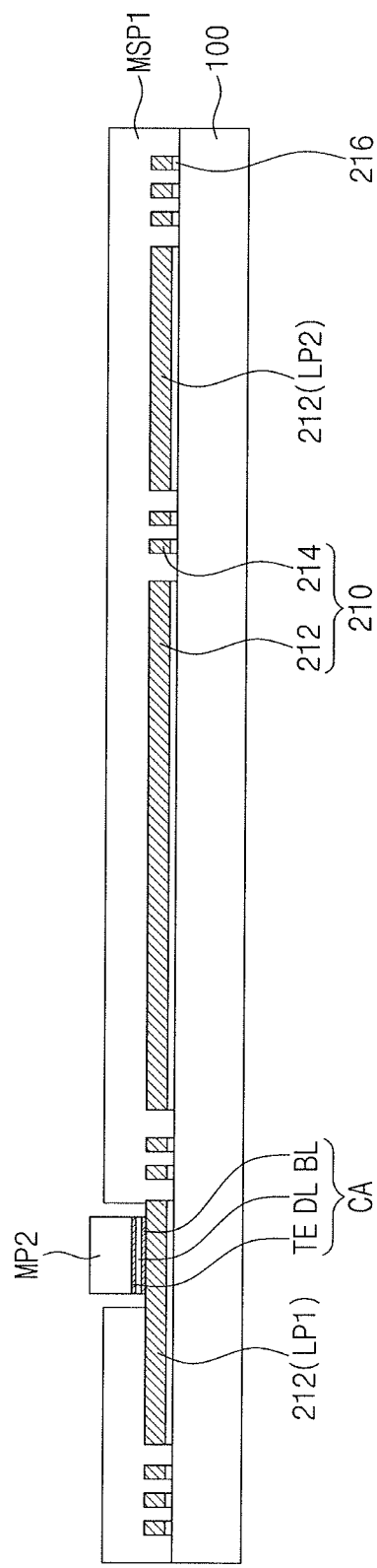

METHOD OF MANUFACTURING REDISTRIBUTION SUBSTRATE

CROSS-REFERENCE TO RELATED APPLICATION

This is a continuation of U.S. patent application Ser. No. 16/676,716 filed Nov. 7, 2019, which is incorporated by reference herein in its entirety.

Korean Patent Application No. 10-2019-0017514, filed on Feb. 15, 2019, in the Korean Intellectual Property Office, and entitled: "Redistribution Substrate, Method of Manufacturing the Same, and Semiconductor Package Including the Same," is incorporated by reference herein in its entirety.

BACKGROUND

1. Field

Embodiments relate to a redistribution substrate, a method of manufacturing the same, and a semiconductor package including the same.

2. Description of the Related Art

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the PCB.

With the development of the electronic industry, electronic products have increasing demands for high performance, high speed, and compact size. For example, a size of the semiconductor chip decreases as high integration of the semiconductor chip increases.

SUMMARY

According to some example embodiments, a redistribution substrate may include a first conductive pattern having a first lower pad and a second lower pad that are disposed in a first insulating layer, a second conductive pattern having a first upper pad and a second upper pad that are disposed on the first insulating layer, a first via connecting the first lower pad and the first upper pad to each other in the first insulating layer, a second via connecting the second lower pad and the second upper pad to each other in the first insulating layer, and a capacitor between the first lower pad and the first via.

According to some example embodiments, a redistribution substrate may include a first conductive pattern, a first via connected to a top surface of the first conductive pattern, a capacitor between the first conductive pattern and the first via, a second conductive pattern on the first via, the second pattern including an upper pad connected to the first via and a plurality of upper connection lines spaced apart from the upper pad, and a second via connected to a top surface of the upper pad. The capacitor may include a barrier layer, a dielectric layer, and a top electrode that are sequentially stacked on the top surface of the first conductive pattern.

According to some example embodiments, a semiconductor package may include a first conductive pattern and a second conductive pattern that are vertically spaced apart from each other in an insulating layer, a plurality of first vias that connect the first conductive pattern and the second conductive pattern to each other, a capacitor between the first conductive pattern and one of the first vias, a plurality of second vias on the second conductive pattern, a plurality of under-bump pads on the insulating layer and connected to the second vias, and a semiconductor chip mounted on the under-bump pads.

According to some example embodiments, a method of manufacturing a redistribution substrate may include forming a first conductive pattern on a substrate, forming a capacitor by sequentially stacking a barrier layer, a dielectric layer, and a top electrode on the first conductive pattern, forming a first insulating layer covering the first conductive pattern and the capacitor, the first insulating layer having a first through hole that exposes a top surface of the capacitor, and forming a first via and a second conductive pattern on the first insulating layer. The first via may be formed in the first through hole and may be connected to the capacitor.

According to some example embodiments, a method of manufacturing a redistribution substrate may include forming a first conductive pattern, forming on the first conductive pattern a first insulating layer that has a first recess exposing the first conductive pattern, sequentially depositing in the first recess a barrier layer, a dielectric layer, and a top electrode to form a capacitor that fills a lower portion of the first recess, and forming a first via and a second conductive pattern on the first insulating layer. The first via may be formed to fill a remaining portion of the first recess and to have connection with the capacitor.

BRIEF DESCRIPTION OF THE DRAWINGS

Features will become apparent to those of skill in the art by describing in detail exemplary embodiments with reference to the attached drawings, in which:

FIGS. 7 to 19 illustrate cross-sectional views of stages in a method of manufacturing a redistribution substrate according to some example embodiments.

DETAILED DESCRIPTION

Figure 1:
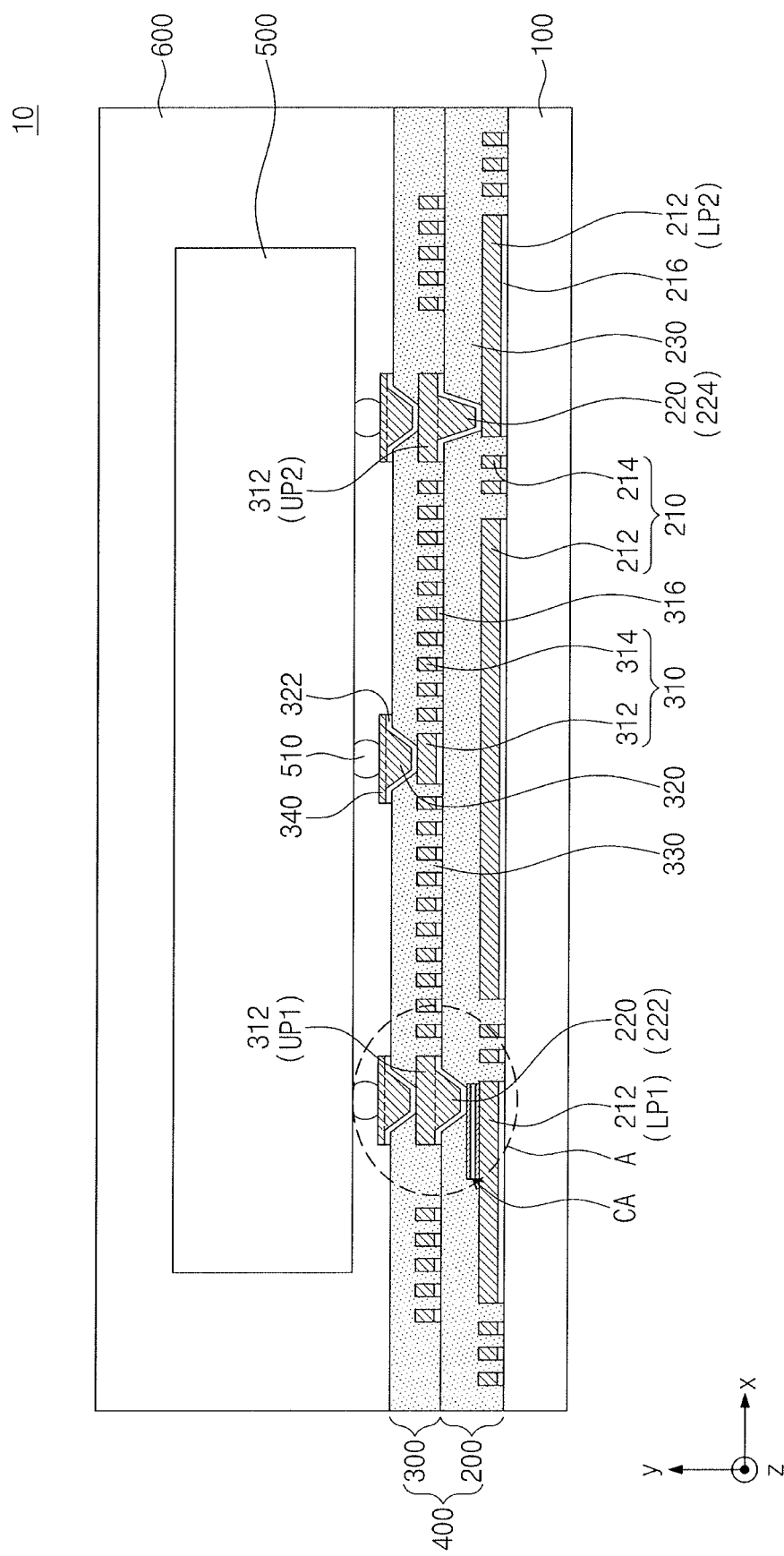
FIG. 1 illustrates a cross-sectional view of a semiconductor package according to some example embodiments.
Figure 2:
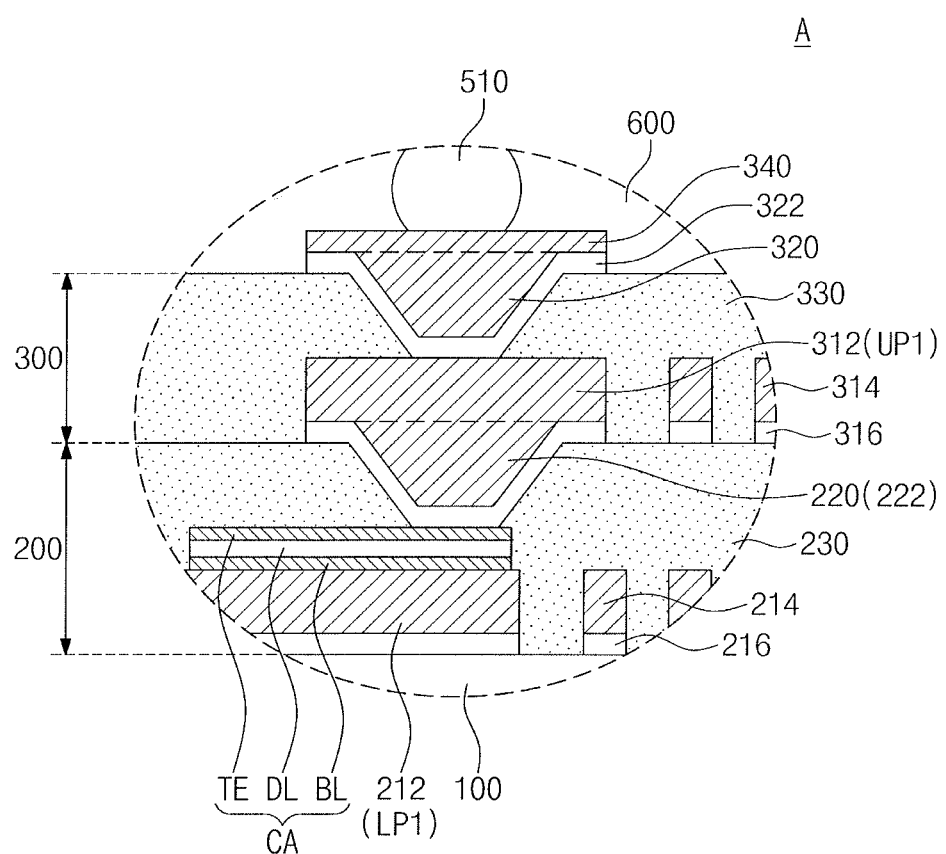
FIG. 2 illustrates an enlarged view of section A in FIG. 1.

FIG. 1 illustrates a cross-sectional view of a semiconductor package according to some example embodiments. FIG. 2 illustrates an enlarged view of section A in FIG. 1.

Referring to FIG. 1, a semiconductor package 10 according to some example embodiments may include a redistribution substrate 400, a semiconductor chip 500, and a molding layer 600.

The redistribution substrate 400 may be provided on a bottom surface of the semiconductor chip 500 and a bottom surface of the molding layer 600. The redistribution substrate 400 may have a thickness less than that of the semiconductor chip 500, e.g., along the y-axis. The redistribution substrate 400 may include at least one connection line layer. The connection line layer may be provided in plural. In some embodiments, the redistribution substrate 400 may include a first connection line layer 200 and a second connection line layer 300. The following will describe in detail the redistribution substrate 400 with reference to FIGS. 1 and 2.

Referring to FIG. 1, a support substrate 100 may be provided. The support substrate 100 may include, e.g., a silicon substrate or a dielectric substrate. The support substrate 100 may be omitted as needed.

The first connection line layer 200 may be provided on the support substrate 100. The first connection line layer 200 may include a first conductive pattern 210, first vias 220, a first insulating layer 230, and a capacitor CA.

The first conductive pattern 210 may be provided on the support substrate 100. The first conductive pattern 210 may include a conductive material, e.g., copper (Cu), aluminum (Al), or a copper alloy. The first conductive pattern 210 may include lower pads 212 and first connection lines 214.

In this description, referring to FIG. 1, the first connection lines 214 may extend in a direction parallel to a top surface of the support substrate 100, e.g., along the z-axis, and may be defined as components that constitute an electrical circuit, and the lower pads 212 may be formed to have widths greater than those of the first connection lines 214, e.g., along the x-axis, and may be defined as components to which the first connection lines 214 and the first vias 220 are coupled. The lower pads 212 may include a first lower pad LP1 and a second lower pad LP2 that are spaced apart from each other, e.g., along the x-axis. The first connection lines 214 may be placed either between the lower pads 212 (e.g., between the first lower pad LP1 and the second lower pad LP2) or on sides of the lower pads 212. The first connection lines 214 may be electrically connected to the lower pads 212. In this description, the phrase "electrically connected/coupled to" may include "directly or indirectly electrically connected/coupled to."

A first seed layer 216 may be provided between the first conductive pattern 210 and the support substrate 100. The first seed layer 216 may include, e.g., copper (Cu). The first seed layer 216 may have a thickness of about 5 Å to about 50 Å, e.g., along the y-axis.

The first vias 220 may be disposed on the first conductive pattern 210. For example, the first vias 220 may be disposed on a top surface of at least one of the lower pads 212. In this description, the first vias 220 are defined as components that vertically connect the first conductive pattern 210 in the first connection line layer 200 to a second conductive pattern 310, which will be discussed below, in the second connection line layer 300. In other words, the first vias 220 refer to openings in the first insulating layer 230 and a conductive filling therein that electrically connects the first and second conductive patterns 210 and 310. The first vias 220 may have lateral surfaces that are inclined relative to a top surface of the first conductive pattern 210. For example, each of the first vias 220 may have a tapered shape whose width increases with increasing distance from the first conductive pattern 210. The first vias 220 may include a first sub-via 222 provided on the first lower pad LP1 and a second sub-via 224 provided on the second lower pad LP2. The first vias 220 may be electrically connected through the lower pads 212 to the first connection lines 214. The first vias 220 may include a conductive material, e.g., copper (Cu), aluminum (Al), or a copper alloy.

The capacitor CA may be provided between the first sub-via 222 and the first lower pad LP1. The capacitor CA may be disposed on a top surface of the first lower pad LP1. The first lower pad LP1, the capacitor CA, and the first sub-via 222 may vertically overlap each other. The capacitor CA may have a width the same as or less than that of the first lower pad LP1, e.g., along the x-axis. The width of the capacitor CA may be the same as or greater than that of the first sub-via 222, e.g., along the x-axis. The capacitor CA may include a barrier layer BL, a dielectric layer DL, and a top electrode TE that are sequentially stacked. The barrier layer BL, the dielectric layer DL, and the top electrode TE may have the same width, e.g., in the x-axis. The first lower pad LP1 may serve as a bottom electrode of the capacitor CA. The following will describe in detail a configuration of the capacitor CA together with reference to FIG. 2.

Referring to FIGS. 1 and 2, the barrier layer BL may be disposed, e.g., directly, on the first lower pad LP1. The barrier layer BL may include, e.g., titanium nitride (TiN), titanium aluminum (TiAl), titanium aluminum nitride (TiAlN), a metal compound containing titanium nitride (TiN), tantalum nitride (TaN), tantalum aluminum nitride (TaAlN), tantalum aluminum carbonitride (TaAlCN), or a metal compound containing tantalum nitride (TaN). The barrier layer BL, together with the first lower pad LP1, may serve as a bottom electrode of the capacitor CA. The barrier layer BL may prevent the dielectric layer DL from receiving a metallic material diffused from the first lower pad LP1.

The dielectric layer DL may be disposed, e.g., directly, on the barrier layer BL. The dielectric layer DL may include a high-k dielectric material. For example, the high-k dielectric material may include silicon nitride ($SiN_x$), zirconium oxide ($ZrO_2$), hafnium oxide ($HfO_2$), titanium oxide ($TiO_2$), tantalum oxide ($Ta_2O_5$), aluminum oxide ($Al_2O_3$), strontium titanium oxide ($SrTiO_3$), or barium titanium oxide ($BaTiO_3$), but embodiments are not limited thereto.

The top electrode TE may be disposed, e.g., directly, on the dielectric layer DL. The top electrode TE may include a conductive material. The top electrode TE may include metal or a conductive metal compound. For example, the metal compound may include titanium nitride (TiN), titanium aluminum (TiAl), titanium aluminum nitride (TiAlN), a metal compound containing titanium nitride (TiN), tantalum nitride (TaN), tantalum aluminum nitride (TaAlN), tantalum aluminum carbonitride (TaAlCN), or a metal compound containing tantalum nitride (TaN). The top electrode TE may serve as an electrode of the capacitor CA. When the top electrode TE includes a metal compound, the top electrode TE may prevent the dielectric layer DL from receiving a metallic material diffused from the second conductive pattern 310 which will be discussed below.

Because the capacitor CA is provided on the first lower pad LP1, the first sub-via 222 on the first lower pad LP1 may connect the capacitor CA to the second conductive pattern 310, which will be discussed below, of the second connection line layer 300, and the second sub-via 224 on the second lower pad LP2 may connect the second lower pad LP2 to the second conductive pattern 310 of the second connection line layer 300. The first sub-via 222 may be coupled to a top surface of the capacitor CA, and the second sub-via 224 may be coupled to a top surface of the second lower pad LP2. Therefore, the first sub-via 222 may have a height less than that of the second sub-via 224, e.g., along the y-axis. For example, a sum of heights, e.g., thicknesses, of the first sub-via 222 and the capacitor CA may be the same as the height of the second sub-via 224, e.g., as measured from a top surface of the first conductive pattern 210 to a top surface of the first insulating layer 230 along the y-axis.

Returning to FIG. 1, the first insulating layer 230 may be provided on the support substrate 100. The first insulating layer 230 may cover the first conductive pattern 210 and surround the first vias 220. The first insulating layer 230 may contact at least a portion of the top surface of the first lower pad LP1, the top surface of the second lower pad LP2, and a lateral surface of the capacitor CA (or a lateral surface of the barrier layer BL, a lateral surface of the dielectric layer DL, and a lateral surface of the top electrode TE). When the capacitor CA and the first lower pad LP1 have the same width, e.g., along the x and z axes, the first insulating layer 230 may not contact the top surface of the first lower pad LP1. The first insulating layer 230 may have a top surface coplanar with tops of openings of the first vias 220, e.g., the openings of the first vias 220 may be formed in the first insulating layer 230 to extend from the top surface of the first insulating layer 230 toward the first conductive pattern 210. The first insulating layer 230 may include an inorganic material, e.g., silicon oxide ($SiO_x$), silicon nitride ($SiN_x$), and silicon oxynitride (SiON), and/or a polyamide-based polymer material, but embodiments are not limited thereto.

A second seed layer 316 may be provided in the openings of the first vias 220 and on the first conductive pattern 210. For example, as illustrated in FIG. 1, the second seed layer 316 may cover, e.g., conformally, bottom and lateral surfaces of the openings of the first vias 220, so the second seed layer 316 may be between the conductive filling of the first vias 220 and the first conductive pattern 210. On the first lower pad LP1, the second seed layer 316 may be interposed between the capacitor CA and the conductive filling of the first sub-via 222, and on the second lower pad LP2, the second seed layer 316 may be interposed between the second lower pad LP2 and the conductive filling of the second sub-via 224. The second seed layer 316 may separate the conductive filling of the first vias 220 from the first insulating layer 230. The second seed layer 316 may extend on an upper surface of the first insulating layer 230 to a predetermined length along the x-axis to a location between the second conductive pattern 310 and the first insulating layer 230. For example, the second seed layer 316 may be provided on a bottom surface of the second conductive pattern 310. The second seed layer 316 may include copper (Cu). The second seed layer 316 may have a thickness of about 5 Å to about 50 Å.

The second connection line layer 300 may be provided, e.g., directly, on the first connection line layer 200. The second connection line layer 300 may include the second conductive pattern 310, second vias 320, and a second insulating layer 330.

The second conductive pattern 310 may be provided on the first connection line layer 200. The second conductive pattern 310 may include upper pads 312 and second connection lines 314. In this description, the second connection lines 314 may extend in a direction parallel to a top surface of the first connection line layer 200, e.g., along the z-axis, and may be defined as components that constitute an electrical circuit, and the upper pads 312 may be formed to have widths greater than those of the second connection lines 314, e.g., along the x-axis, and may be defined as components to which the second connection lines 314 and the second vias 320 are coupled.

The upper pads 312 may include a first upper pad UP1 and a second upper pad UP2 that are spaced apart from each other, e.g., along the x-axis (i.e., the first and second upper pads UP1 and UP2 are the hatched portions above the dashed lines in FIG. 1). The upper pads 312 may be disposed on and coupled to the first vias 220. For example, the first upper pad UP1 may be in contact with the first sub-via 222, and the second upper pad UP2 may be in contact with the second sub-via 224. An interval between the first upper pad UP1 and the first lower pad LP1 may be the same as that between the second upper pad UP2 and the second lower pad LP2. The upper pads 312 may be electrically connected through the first vias 220 to the lower pads 212. For example, the first upper pad UP1 may be connected to the first lower pad LP1 through the first sub-via 222 and the capacitor CA, and the second upper pad UP2 may be connected to the second lower pad LP2 through the second sub-via 224.

The second connection lines 314 may be disposed on the first insulating layer 230. When viewed in a plan view, the second connection lines 314 may be placed either between the upper pads 312 or on sides of the upper pads 312. The second connection lines 314 may serve as redistribution lines. The second connection lines 314 may be electrically connected to the upper pads 312. A portion of the second conductive pattern 310 and the first vias 220 may be integrally connected to each other. For example, a portion of the second conductive pattern 310 may include the same material as that of the first vias 220. The second conductive pattern 310 may include a conductive material. For example, the second conductive pattern 310 may include copper (Cu), aluminum (Al), or a copper alloy.

The second vias 320 may be disposed on the second conductive pattern 310. The second vias 320 may be correspondingly disposed on top surfaces of the upper pads 312. In this description, the second vias 320 may be defined as components that vertically connect the second conductive pattern 310 in the second connection line layer 300 to under-bump pads 340 which will be discussed below. In other words, the second vias 320 refer to openings in the second insulating layer 330 and a conductive filling therein that electrically connects the second conductive pattern 310 and the under-bump pads 340. The second vias 320 may have their lateral surfaces that are inclined relative to a top surface of the second conductive pattern 310. For example, each of the second vias 320 may have a tapered shape whose width increases with increasing distance from the second conductive pattern 310. The second vias 320 may be electrically connected through the upper pads 312 to the second connection lines 314. The second vias 320 may include a conductive material.

The second insulating layer 330 may be provided on the first connection line layer 200. The second insulating layer 330 may cover the second conductive pattern 310 and surround the second vias 320. The second insulating layer 330 may contact a lateral surface of the second conductive pattern 310. The second insulating layer 330 may include an inorganic material, e.g., silicon oxide ($SiO_x$), silicon nitride ($SiN_x$), and silicon oxynitride (SiON), and/or a polyamide-based polymer material, but embodiments are not limited thereto.

The under-bump pads 340 may be disposed on top surfaces of the second vias 320. The under-bump pads 340 may be formed to have widths greater than those of the second vias 320, e.g., along the x-axis, and may be defined as components to which the second vias 320 and connection terminals 510 are coupled. Each of the under-bump pads 340 may have a width greater than that of each of the upper pads 312. The width of each of the under-bump pads 340 may be greater than that of the top surface of each of the second vias 320. The under-bump pads 340 and the second vias 320 may be integrally connected to each other. For example, the under-bump pads 340 may include the same material as that of the second vias 320. The under-bump pads 340 may include a conductive material.

In the first insulating layer 230, the first conductive pattern 210 may include circuits (e.g., the first connection lines 214 and the lower pads 212) extending in a direction parallel to the top surface of the first insulating layer 230. In the second insulating layer 330, the second conductive pattern 310 may include circuits (e.g., the second connection lines 314 and the upper pads 312) extending in a direction parallel to the top surface of the second insulating layer 330. The first vias 220 may vertically connect the first conductive pattern 210 to the second conductive pattern 310, and vertically connect the second conductive pattern 310 to the under-bump pads 340.

According to some example embodiments, the capacitor CA may be provided within the redistribution substrate 400. For example, the capacitor CA may be provided between the first conductive pattern 210 of the first connection line layer 200 and the second conductive pattern 310 of the second connection line layer 300, and the conductive patterns 210 and 310 of the redistribution substrate 400 may be used as electrodes of the capacitor CA. Therefore, the redistribution substrate 400 may not need a space in which the capacitor CA is disposed, and thus may contribute to compactness of the redistribution substrate 400 and the semiconductor package 10 including the redistribution substrate 400. Furthermore, the capacitor CA may include the barrier layer BL, which may prevent the dielectric layer DL from damages caused by diffusion of a metallic material from the first conductive pattern 210 serving as an electrode of the capacitor CA. As a result, it may be possible to improve reliability of the redistribution substrate 400 and the semiconductor package 10 including the redistribution substrate 400.

Referring back to FIG. 1, a third seed layer 322 may be provided between the second conductive pattern 310 and the conductive filling in the second vias 320. The third seed layer 322 may extend from bottom surfaces of the second vias 320 along the lateral surfaces of the second vias 320 toward spaces between the second insulating layer 330 and the under-bump pads 340. For example, the third seed layer 322 may separate the second insulating layer 330 from the conductive filing in the second vias 320 and the under-bump pads 340. According to embodiments, the redistribution substrate 400 may be provided as discussed above.

The semiconductor chip 500 may be placed on a top surface of the redistribution substrate 400. The semiconductor chip 500 may have a bottom surface or an active surface facing the redistribution substrate 400. The semiconductor chip 500 may include, e.g., silicon (Si). The semiconductor chip 500 may be flip-chip bonded to the redistribution substrate 400. For example, the semiconductor chip 500 may have connection terminals 510 on the bottom surface thereof. The connection terminals 510 may be coupled to the under-bump pads 340 of the redistribution substrate 400. The connection terminals 510 may include, e.g., solder balls or solder bumps. The semiconductor chip 500 may be electrically connected to the second connection lines 314 through the under-bump pads 340 and the second vias 320 of the redistribution substrate 400. The redistribution substrate 400 may use the second connection lines 314 to redistribute the semiconductor chip 500.

In other embodiments, the semiconductor chip 500 provided on the redistribution substrate 400 may include no transistors therein. For example, differently from that shown, the redistribution substrate 400 may be provided thereon without a chip, but with an interposer substrate. The interposer substrate may include, e.g., silicon (Si). The interposer substrate may have a wiring circuit on a top surface thereof. The interposer substrate may be surrounded by a mold layer, as needed. The mold layer may be a component distinguishing from the molding layer 600. The mold layer may encapsulate the interposer substrate on the redistribution substrate 400. In this sense, the interposer substrate may be covered with the mold layer. The interposer substrate may be provided thereon with at least one device, e.g., a chip including a transistor or an electronic device required in a semiconductor package. The at least one device may be electrically connected to the redistribution substrate 400 and the interposer substrate through vias that penetrate the interposer substrate. Alternatively, when no mold layer is provided, the at least one device may be directly mounted on the interposer substrate. When the device is provided in plural, the interposer substrate may electrically connect the plurality of devices to each other. If necessary, the at least one device and the interposer substrate (or the mold layer) may be provided therebetween with an additional substrate that supports the at least one device. In this case, the at least one device may be mounted on the additional substrate, and may be electrically connected to the interposer substrate and the redistribution substrate 400 through the additional substrate and the vias. The following will discuss an example in which the semiconductor chip 500 is provided on the redistribution substrate 400.

The molding layer 600 may be provided on the redistribution substrate 400. On the top surface of the redistribution substrate 400, the molding layer 600 may encapsulate the semiconductor chip 500. For example, the molding layer 600 may cover top and lateral surfaces of the semiconductor chip 500. The molding layer 600 may fill a space between the semiconductor chip 500 and the redistribution substrate 400. The molding layer 600 may include a dielectric material, e.g., an epoxy-based polymer. Alternatively, an underfill member may fill the space between the semiconductor chip 500 and the redistribution substrate 400.

Figure 3:
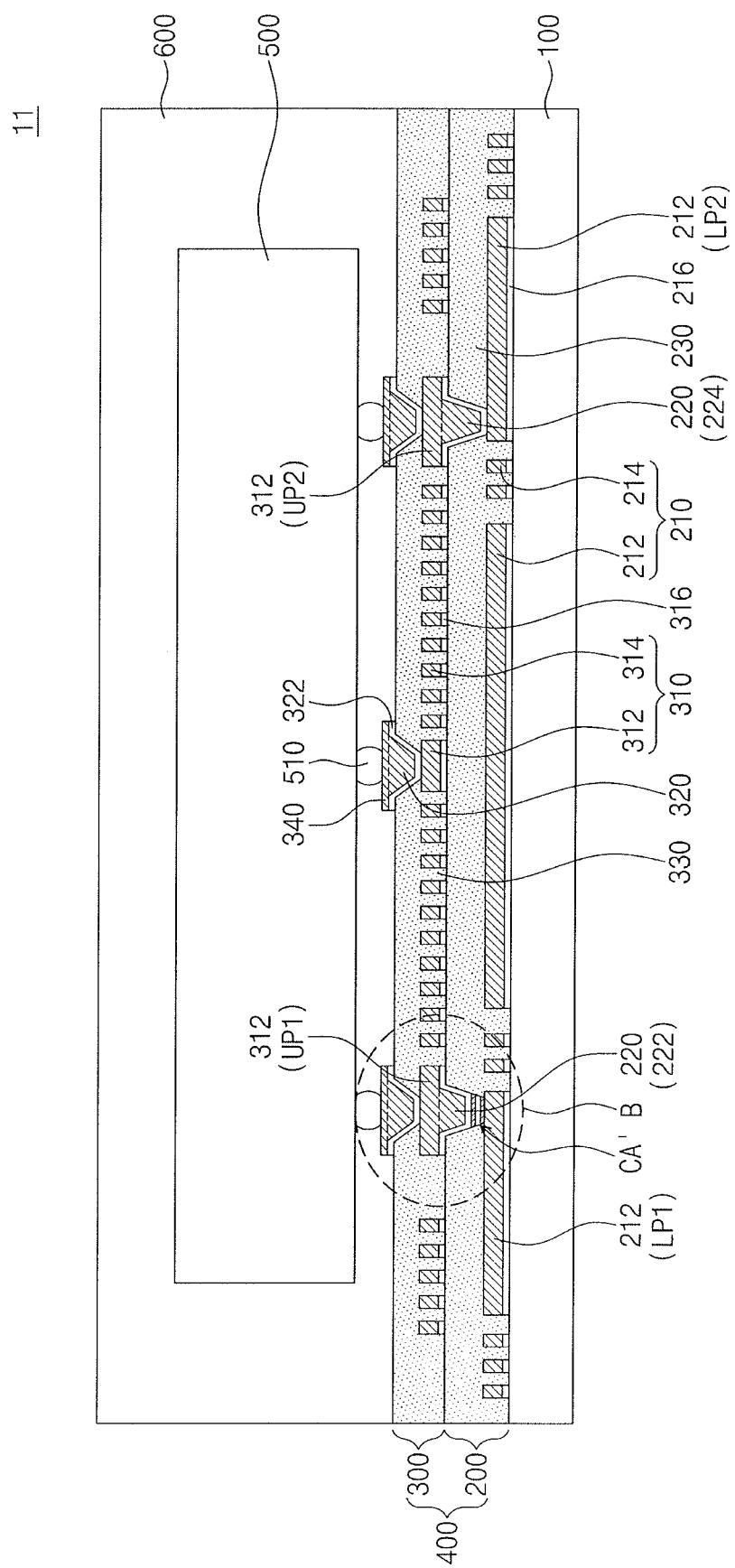
FIG. 3 illustrates a cross-sectional view of a semiconductor package according to some example embodiments.
Figure 4:
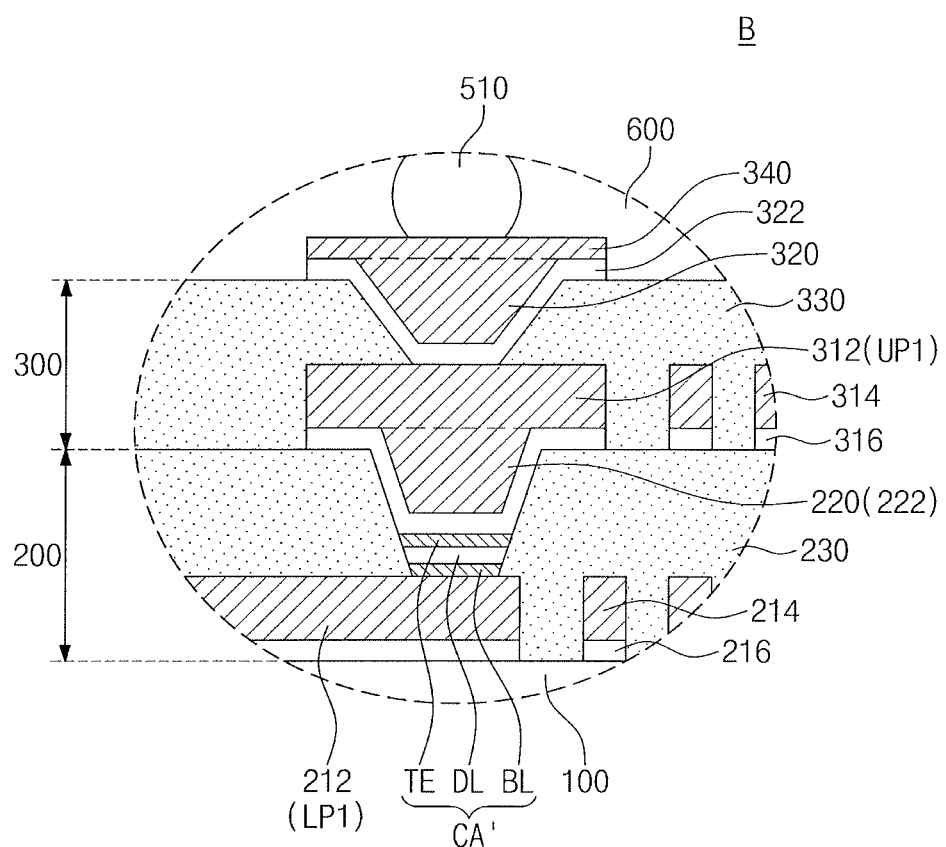
FIG. 4 illustrates an enlarged view of section B in FIG. 3.

FIG. 3 illustrates a cross-sectional view of a semiconductor package according to some example embodiments. FIG. 4 illustrates an enlarged view of section B of FIG. 3. A duplicate explanation will be omitted for convenience of description.

Referring to FIGS. 3 and 4, a semiconductor package 11 may include the first vias 220 that have an identical or similar shape to those of the semiconductor package 10 in FIGS. 1 and 2. For example, the first sub-via 222 may have a tapered shape whose width decreases with increasing distance from the second conductive pattern 310. A capacitor CA' may have identical or similar position and layers therein as in the semiconductor package 10 in FIGS. 1 and 2, with the exception that it has a tapered shape whose width decreases with increasing distance from the first sub-via 222. The capacitor CA' may have a lateral surface coplanar with that of the first sub-via 222. Therefore, the top electrode TE may have a width greater than that of the dielectric layer DL, and the width of the dielectric layer DL may be greater than that of the barrier layer BL. The capacitor CA' may have a top surface whose width is the same as that of a bottom surface of the first sub-via 222.

Figure 5:
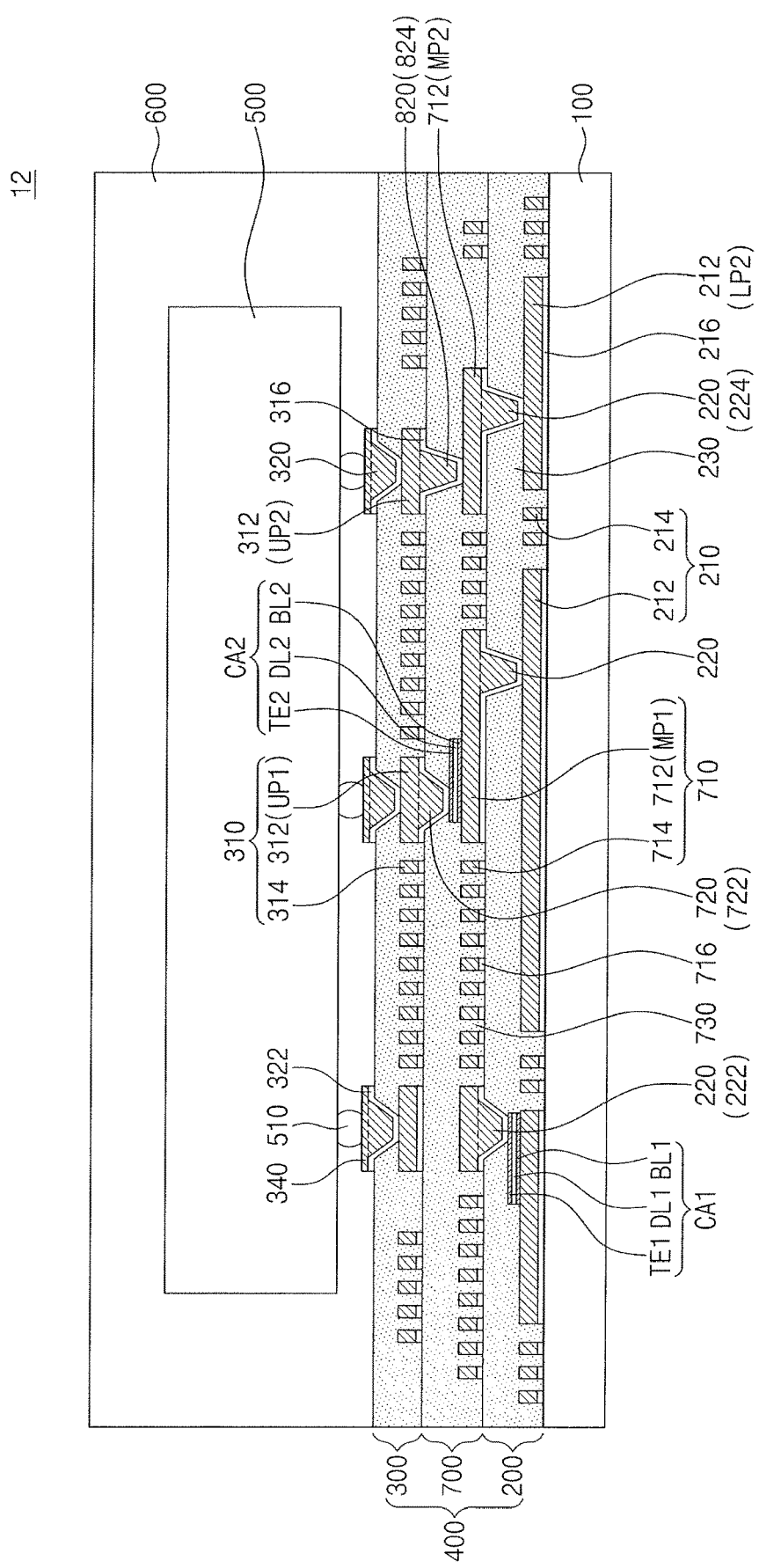
FIG. 5 illustrates a cross-sectional view of a semiconductor package according to some example embodiments.

In other embodiments, the redistribution substrate 400 may include two or more connection line layers. FIG. 5 illustrates a cross-sectional view showing a semiconductor package according to some example embodiments.

Referring to FIG. 5, in a semiconductor package 12, the redistribution substrate 400 may further include a third connection line layer 700 between the first connection line layer 200 and the second connection line layer 300. The support substrate 100 may be provided thereon with the first connection line layer 200, the second connection line layer 300, and the third connection line layer 700.

The first connection line layer 200 may include the first conductive pattern 210, the first vias 220, the first insulating layer 230, and a first capacitor CA1. The first capacitor CA1 may include a first barrier layer BL1, a first dielectric layer DL1, and a first top electrode TE1 that are sequentially stacked on the top surface of the first lower pad LP1 of the first conductive pattern 210. The first vias 220 may be coupled to the first capacitor CA1 and the second lower pad LP2.

The second connection line layer 300 may be provided on the first connection line layer 200. The second connection line layer 300 may include the second conductive pattern 310, the second vias 320, and the second insulating layer 330.

The third connection line layer 700 may be provided between the first connection line layer 200 and the second connection line layer 300. The third connection line layer 700 may include a third conductive pattern 710, third vias 720, and a third insulating layer 730.

The third conductive pattern 710 may be provided on the first connection line layer 200. The third conductive pattern 710 may include middle pads 712 and third connection lines 714. The middle pads 712 may be disposed on and coupled to the first vias 220. Each of the middle pads 712 may have a width greater than that of each of the first vias 220. The middle pads 712 may include a first middle pad MP1 and a second middle pad MP2 that are spaced apart from each other. The third connection lines 714 may be placed either between the middle pads 712 or on sides of the middle pads 712. The third connection lines 714 may serve as redistribution lines.

The third vias 720 may be disposed on the third conductive pattern 710. For example, the third vias 720 may be disposed on a top surface of at least one of the middle pads 712. The third vias 720 on the middle pads 712 may be coupled to the upper pads 312. Each of the third vias 720 may have a tapered shape whose width increases with increasing distance from the third conductive pattern 710. The third vias 720 may include a third sub-via 722 provided on the first middle pad MP1 and a fourth sub-via 724 provided on the second middle pad MP2. The third vias 720 may be electrically connected through the middle pads 712 to the third connection lines 714. As discussed previously with reference to the first and second vias, the third vias 720 refer to openings in an insulating layer and a conductive filling therein.

A second capacitor CA2 may be provided between the third sub-via 722 and the first middle pad MP1. The second capacitor CA2 may be disposed on a top surface of the first middle pad MP1. The second capacitor CA2 may have a width the same as or less than that of the first middle pad MP1. The width of the second capacitor CA2 may be the same as or greater than that of the third sub-via 722. The second capacitor CA2 may include a second barrier layer BL2, a second dielectric layer DL2, and a second top electrode TE2 that are sequentially stacked. The second barrier layer BL2, the second dielectric layer DL2, and the second top electrode TE2 may have the same width. The first middle pad MP1 may serve as a bottom electrode of the second capacitor CA2.

The second barrier layer BL2 may be disposed on the first middle pad MP1. The second barrier layer BL2, together with the first middle pad MP1, may serve as a bottom electrode of the second capacitor CA2. The second barrier layer BL2 may prevent the second dielectric layer DL2 from receiving a metallic material diffused from the first middle pad MP1.

The second dielectric layer DL2 may be disposed on the second barrier layer BL2. The second dielectric layer DL2 may include a high-k dielectric material.

The second top electrode TE2 may be disposed on the second dielectric layer DL2. The second top electrode TE2 may include a conductive material. The second top electrode TE2 may serve as an electrode of the second capacitor CA2. When the second top electrode TE2 includes a metal compound, the second top electrode TE2 may prevent the dielectric layer DL from receiving a metallic material diffused from the second conductive pattern 310.

Because the second capacitor CA2 is provided on the first middle pad MP1, the third sub-via 722 on the first middle pad MP1 may connect the second capacitor CA2 to the second conductive pattern 310 of the second connection line layer 300, and the fourth sub-via 724 on the second middle pad MP2 may connect the second middle pad MP2 to the second conductive pattern 310 of the second connection line layer 300. The third sub-via 722 may be coupled to a top surface of the second capacitor CA2, and the fourth sub-via 724 may be coupled to a top surface of the second middle pad MP2. Therefore, the third sub-via 722 may have a height less than that of the fourth sub-via 724. For example, a sum of heights of the third sub-via 722 and the second capacitor CA2 may be the same as the height of the fourth sub-via 724.

A fourth seed layer 716 may be provided between the third conductive pattern 710 and the conductive filling in the third vias 720. The fourth seed layer 716 may extend from bottom surfaces of the third vias 720 along lateral surfaces of the third vias 720 toward spaces between the third insulating layer 730 and the second conductive pattern 310.

The third insulating layer 730 may be provided on the first connection line layer 200. The third insulating layer 730 may cover the third conductive pattern 710 and the second capacitor CA2, and may surround the third vias 720. The third insulating layer 730 may contact the lateral surfaces of the third vias 720, the top surface of the second capacitor CA2, and the top surface of the third conductive pattern 710. The third insulating layer 730 may contact a bottom surface of the second connection line layer 300.

FIG. 5 shows the redistribution substrate 400 including three connection line layers 200, 300, and 700, but embodiments are not limited thereto. The redistribution substrate 400 may include more than three connection line layers.

According to some example embodiments, a plurality of the capacitors CA1 and CA2 may be provided within the redistribution substrate 400. Therefore, the redistribution substrate 400 may not need a space in which the capacitors CA1 and CA2 are disposed, and thus may contribute to compactness of the redistribution substrate 400 and the semiconductor package 12 including the redistribution substrate 400.

Figure 6:
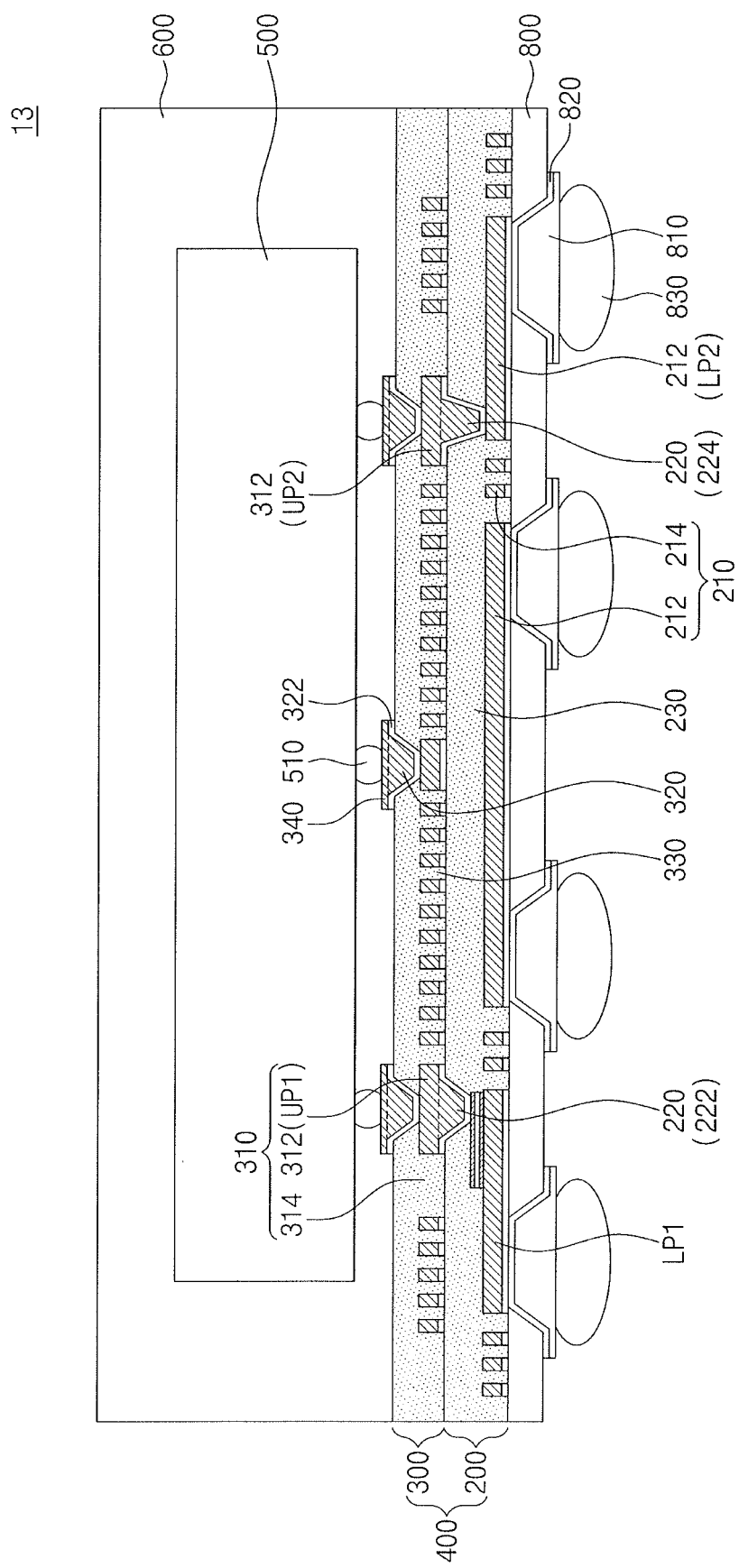
FIG. 6 illustrates a cross-sectional view of a semiconductor package according to some example embodiments.

In other embodiments, the redistribution substrate 400 may be provided with external terminals below the first connection line layer 200. FIG. 6 illustrates a cross-sectional view showing a semiconductor package according to some example embodiments.

Referring to FIG. 6, a semiconductor package 13 may be configured such that the redistribution substrate 400 is provided on its bottom surface with a passivation layer 800 instead of the support substrate (see 100 of FIG. 1). The passivation layer 800 may include an organic material, an inorganic material, an ajinomoto build-up film (ABF), or a dielectric polymer, e.g., epoxy-based polymer. The passivation layer 800 may have external terminals 830 on a bottom surface thereof. The external terminals 830 may be disposed on external pads 810 that penetrate the passivation layer 800 and are coupled to the first conductive pattern 210. The external terminals 830 may be electrically connected through the external pads 810 to the lower pads 212 of the redistribution substrate 400. Barrier metal layers 820 may be provided between the passivation layer 800 and the external pads 810. For example, the passivation layer 800 may have recesses that expose the lower pads 212, and the barrier metal layer 820 may cover a bottom surface and an inner wall of the recess. The barrier metal layer 820 may be provided thereon with the external pad 810 filling the recess. The external terminals 830 may include, e.g., solder balls or solder bumps. The external pads 810 may include metal, e.g., copper (Cu). The barrier metal layer 820 may include one or more of, e.g., tantalum (Ta), tantalum nitride (TaN), tantalum silicon nitride (TaSiN), titanium (Ti), titanium nitride (TiN), titanium silicon nitride (TiSiN), tungsten (W), and tungsten nitride (WN).

FIGS. 7 to 19 illustrate cross-sectional views of stages in a method of manufacturing a redistribution substrate according to some example embodiments.

Figure 7:
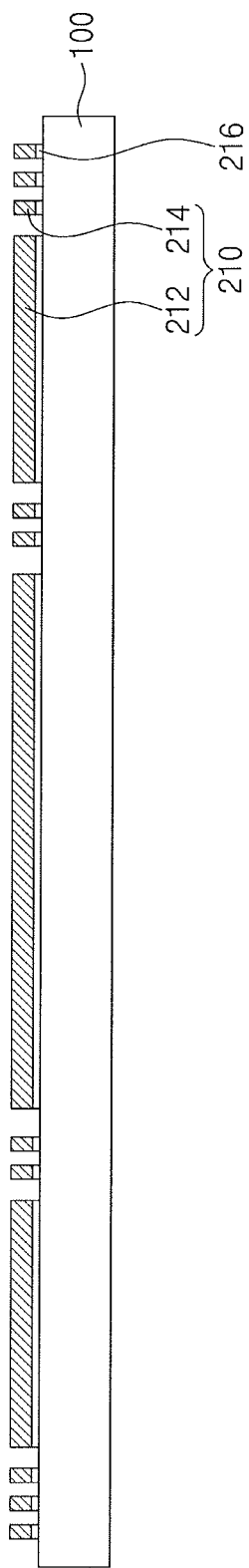

Referring to FIG. 7, the first conductive pattern 210 may be formed on the support substrate 100. For example, the first seed layer 216 may be formed on the support substrate 100, and an etching mask having recesses may be formed on the first seed layer 216. The recesses may define an area in which the first conductive pattern 210 is to be formed. A plating process may be performed to fill the recesses with a conductive material to form the first conductive pattern 210. Afterwards, the etching mask and a portion of the first seed layer 216 may be removed. The first seed layer 216 may remain between the support substrate 100 and the first conductive pattern 210. In another example, a conductive material may be deposited on the support substrate 100, and then patterned to form the first conductive pattern 210. The first conductive pattern 210 may include the lower pads 212 and the first connection lines 214. The lower pads 212 may include the first lower pad LP1 and the second lower pad LP2, as shown in FIG. 8.

Figure 8:
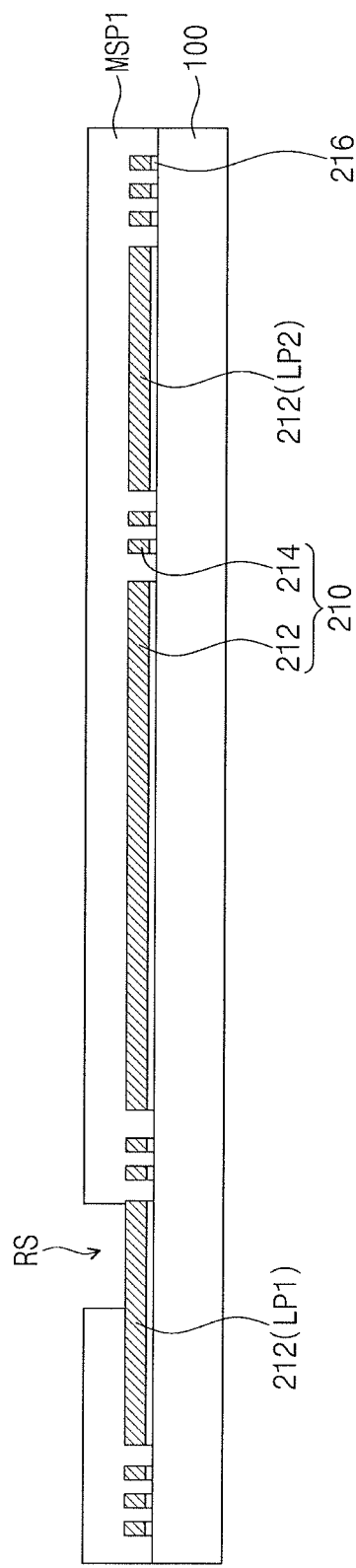

For example, referring to FIG. 8, a first mask pattern MSP1 may be formed on the support substrate 100. For example, the support substrate 100, the first conductive pattern 210, and the first seed layer 216 may be coated thereon with a photosensitive hard mask material to form the first mask pattern MSP1. The photosensitive hard mask material may include, e.g., a resin, a photosensitive material, a cross-linking agent, and a solvent.

A recess RS may be formed on the first mask pattern MSP1. For example, an exposed portion the first mask pattern MSP1 may be dissolved by a developing solution, and a non-exposed portion of the first mask pattern MSP1 may not be dissolved by the developing solution. The recess RS may penetrate the first mask pattern MSP1 and expose a top surface of the first lower pad LP1. The recess RS may have a width the same as or less than that of the first lower pad LP1.

Figure 9:
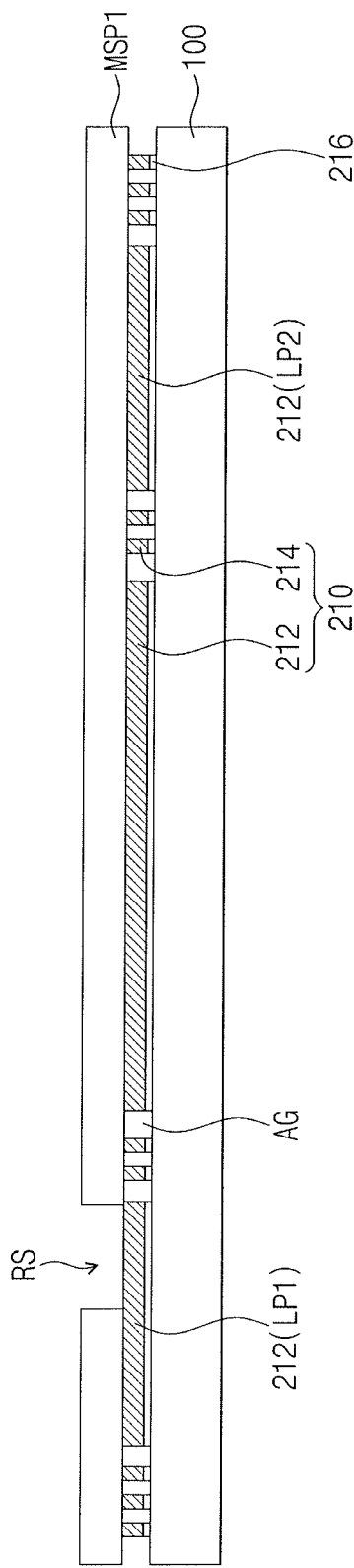

In another example, as shown in FIG. 9, the first mask pattern MSP1 may be a mask having the recess RS already formed thereon. In this case, the first mask pattern MSP1 may have a plate shape and may be disposed on the first conductive pattern 210. The first mask pattern MSP1 may be spaced apart from the support substrate 100 across the first conductive pattern 210, and empty gaps AG may be formed in spaces between the lower pads 212 of the first conductive pattern 210, between the lower pads 212 and the first connection lines 214, and between the first connection lines 214. The first mask pattern MSP1 having the recess RS already formed thereon may be a metal mask or a dielectric hard mask. The following will discuss the embodiment shown in FIG. 8.

Figure 10:
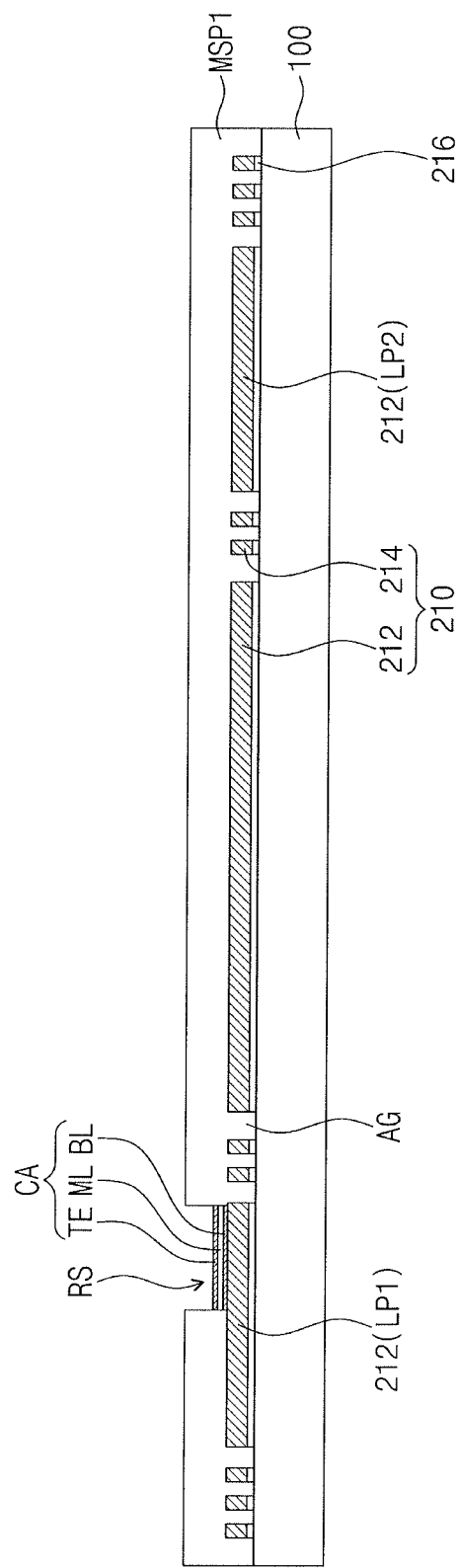

Next, referring to FIG. 10, the capacitor CA may be formed in the recess RS of the first mask pattern MSP1. For example, the barrier layer BL, the dielectric layer DL, and the top electrode TE may be sequentially deposited on the top surface of the first lower pad LP1, which top surface is exposed to the recess RS. A chemical mechanical deposition (CVD) process may be used to form the barrier layer BL, the dielectric layer DL, and the top electrode TE. For example, a barrier material layer may be deposited on the first lower pad LP1 and the first mask pattern MSP1, and then a patterning process may be performed to leave the barrier material layer in the recess RS, which may result in the formation of the barrier layer BL. A dielectric material layer may be deposited on the barrier layer BL and the first mask pattern MSP1, and then a patterning process may be performed to leave the dielectric material layer in the recess RS, which may result in the formation of the dielectric layer DL. A conductive layer may be deposited on the dielectric layer DL and the first mask pattern MSP1, and then a patterning process may be performed to leave the conductive layer in the recess RS, which may result in the formation of the top electrode TE. After that, the first mask pattern MSP1 may be removed. The capacitor CA may be formed as discussed above.

In another example, as shown in FIG. 11, a barrier layer BLa, a dielectric layer DLa, and a conductive layer TEa may be sequentially stacked on the first lower pad LP1 and the first mask pattern MSP1. The barrier layer BLa, the dielectric layer DLa, and the conductive layer TEa may conformally cover an inside of the recess RS. As shown in FIG. 12, a second mask pattern MSP2 may be formed to fill the recess RS, and then the barrier layer BLa, the dielectric layer DLa, and the conductive layer TEa may be partially removed from a top surface of the first mask pattern MSP1. The barrier layer BLa, the dielectric layer DLa, and the conductive layer TEa may remain between the first lower pad LP1 and the second mask pattern MSP2. After that, the first mask pattern MSP1 and the second mask pattern MSP2 may be removed. The capacitor CA may be formed as discussed above.

Figure 13:
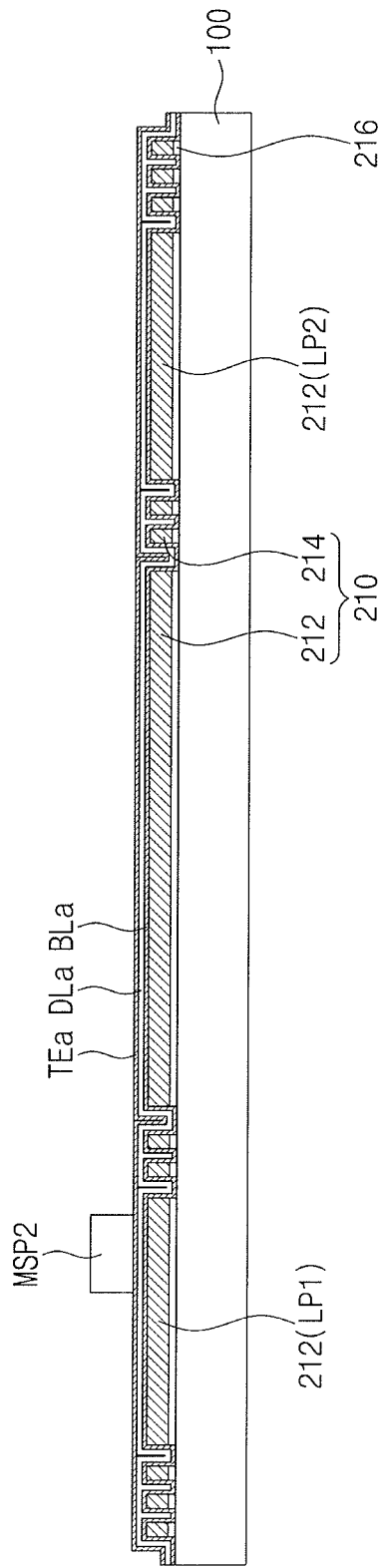

In yet another example, as shown in FIG. 13, a barrier layer BLa, a dielectric layer DLa, and a conductive layer TEa may be sequentially stacked on a resultant structure of FIG. 7. The barrier layer BLa, the dielectric layer DLa, and the conductive layer TEa may cover the first conductive pattern 210. A second mask pattern MSP2 may be formed on the conductive layer TEa. The second mask pattern MSP2 may be formed on the first lower pad LP1. The second mask pattern MSP2 may be used as an etching mask to etch the barrier layer BLa, the dielectric layer DLa, and the conductive layer TEa. After that, the second mask pattern MSP2 may be removed. The capacitor CA may be formed as discussed above. The following will discuss the embodiment shown in FIG. 10.

Figure 14:
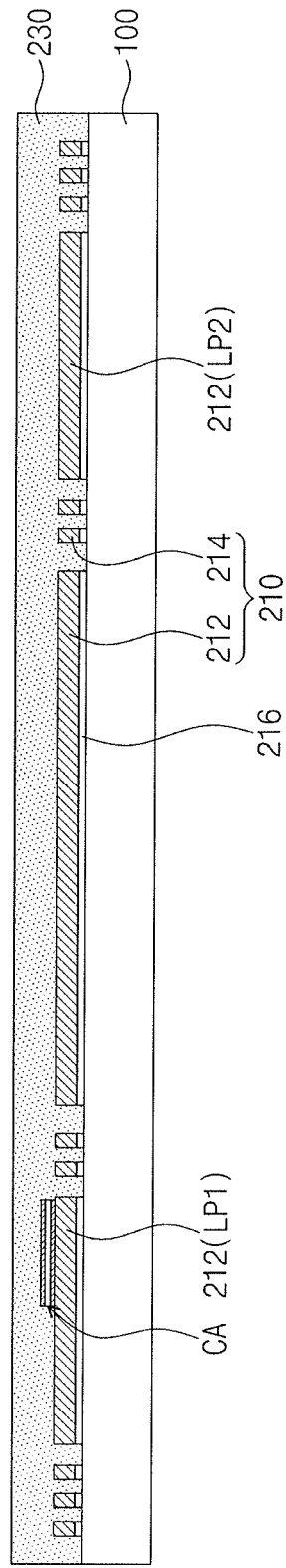

Referring to FIG. 14, the first mask pattern MSP1 may be removed from a resultant structure of FIG. 10, and then a first insulating layer 230 may be formed on the support substrate 100. For example, the support substrate 100, the first conductive pattern 210, and the capacitor CA may be coated or deposited with an encapsulating material to form the first insulating layer 230. The first insulating layer 230 may be formed using, e.g., PECVD (plasma enhanced CVD), HDPCVD (high density plasma CVD), APCVD (atmospheric pressure CVD), spin coating, or the like. The first insulating layer 230 may encapsulate the first conductive pattern 210 and the capacitor CA. A curing process may be optionally performed on the first insulating layer 230.

Figure 15:
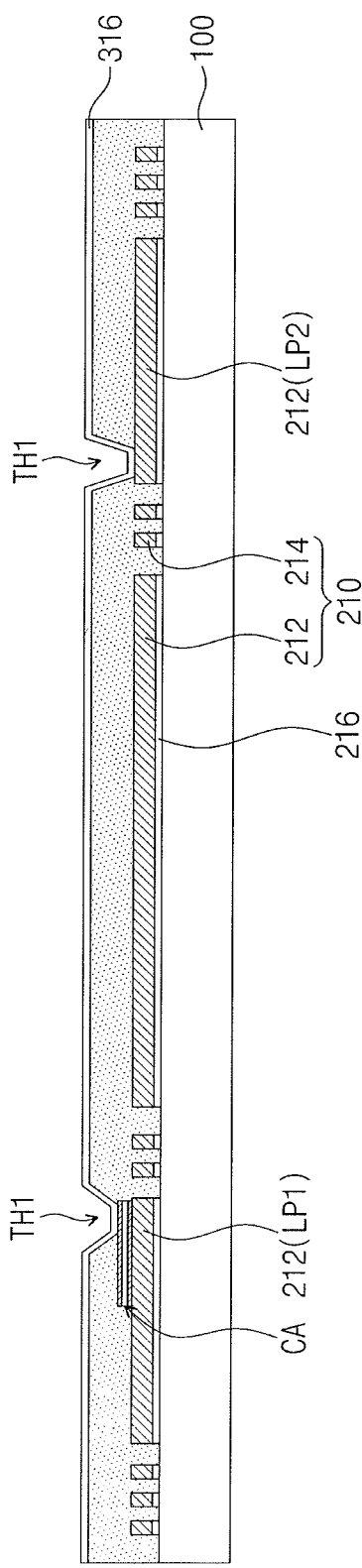

Referring to FIG. 15, first through holes TH1 may be formed on the first insulating layer 230. For example, the first insulating layer 230 may undergo an etching process to form the first through holes TH1. The etching process may over-etch an upper portion of the first insulating layer 230, and thus each of the first through holes TH1 may have a tapered shape whose width increases with increasing distance from the first conductive pattern 210. The first through holes TH1 may penetrate the first insulating layer 230 and may expose a top surface of the capacitor CA and top surfaces of the lower pads 212. For example, on the first lower pad LP1, one of the first through holes TH1 may expose the top surface of the capacitor CA, and on the second lower pad LP2, another of the first through holes TH1 may expose a top surface of the second lower pad LP2. The first through holes TH1 may have a lowermost end whose width is less than that of the capacitor CA. The first through holes TH1 may define areas in which the second vias 320 are to be formed.

The second seed layer 316 may be formed on the first insulating layer 230. The second seed layer 316 may be formed along a top surface of the first insulating layer 230 and along bottom surfaces and inner lateral surfaces of the first through holes TH1.

Figure 16:
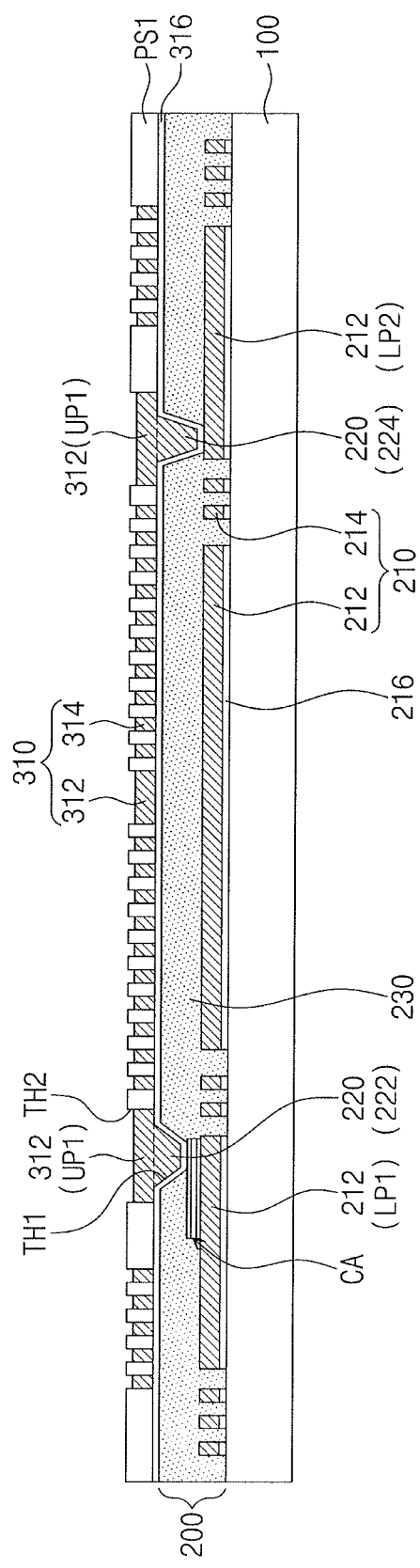

Referring to FIG. 16, a first photosensitive layer PS1 may be formed on the first insulating layer 230. The first photosensitive layer PS1 may be a mask pattern for forming the first vias 220 and the second conductive pattern 310 which will be discussed below. For example, the second seed layer 316 may be coated with a photosensitive hard mask material to form the first photosensitive layer PS1. Second through holes TH2 may be formed on the first photosensitive layer PS1, defining an area in which is formed a second conductive pattern 310 which will be discussed below. The second through holes TH2 may be formed on and spatially connected to the first through holes TH1 of the first insulating layer 230. The second through holes TH2 may expose a top surface of the second seed layer 316. Each of the second through holes TH2 may have a planar shape the same as or larger than that of each of the first through holes TH1.

The first vias 220 and the second conductive pattern 310 may be formed on the lower pads 212. The first vias 220 may be formed by filling the first through holes TH1 with a conductive material. For example, the second seed layer 316 exposed to the first through holes TH1 may be used as a seed to perform a plating process that fills the first through holes TH1 with the conductive material. Based on shapes of the first through holes TH1, each of the first vias 220 may be formed to have a tapered shape whose width increases with increasing distance from the first conductive pattern 210. The second through holes TH2 of the first photosensitive layer PS1 may be filled with a conductive material to form the second conductive pattern 310. For example, the first vias 220 exposed to the second through holes TH2 may be used as a seed to perform a plating process that fills the second through holes TH2 with the conductive material. Although the formation of the first vias 220 and the formation of the second conductive pattern 310 are described separately from each other, the formation of the first vias 220 and the formation of the second conductive pattern 310 may be successively performed to form the first vias 220 and the second conductive pattern 310 integrally with each other. In other embodiments, after the first vias 220 are formed, a separate process may be performed to form the second conductive pattern 310. Through the processes above, the first connection line layer 200 may be formed. The first vias 220 may include the first sub-via 222 on the first lower pad LP1 and the second sub-via 224 on the second lower pad LP2.

Figure 17:
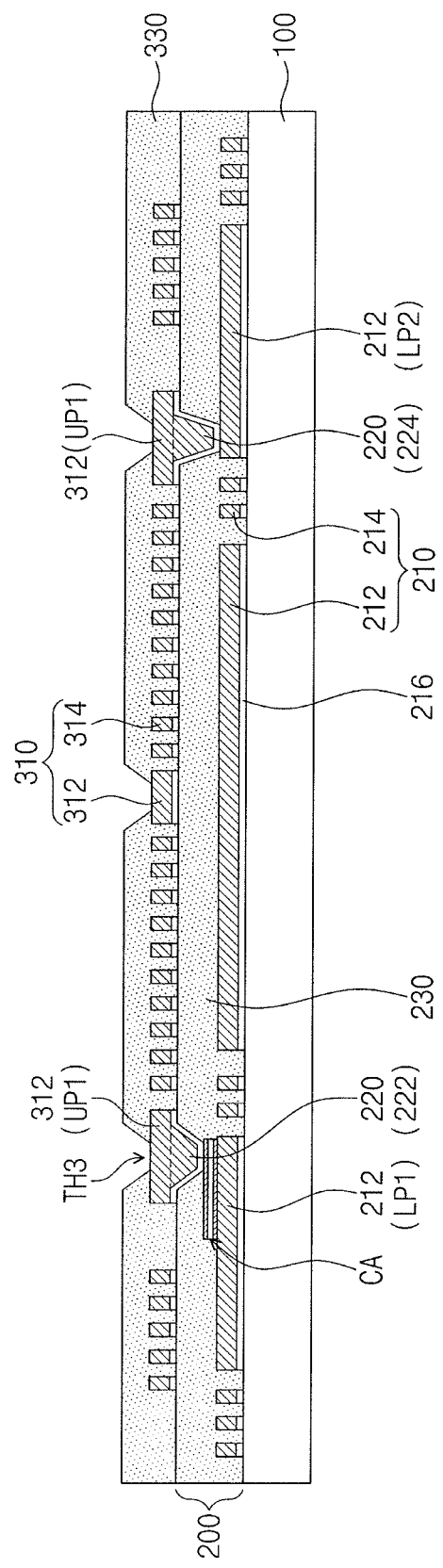

Referring to FIG. 17, the second insulating layer 330 may be formed on the first connection line layer 200. For example, the second insulating layer 330 may be formed by coating or depositing an encapsulating material on the first insulating layer 230 and the second conductive pattern 310. The second insulating layer 330 may be formed using, e.g., PECVD, HDPCVD, APCVD, spin coating, or the like. The second insulating layer 330 may encapsulate the second conductive pattern 310. A curing process may be optionally performed on the second insulating layer 330.

Third through holes TH3 may be formed on the second insulating layer 330. For example, the second insulating layer 330 may undergo an etching process to form the third through holes TH3. The etching process may over-etch an upper portion of the second insulating layer 330, and thus each of the third through holes TH3 may have a tapered shape whose width increases with increasing distance from the second conductive pattern 310. The third through holes TH3 may penetrate the second insulating layer 330 and may expose top surface of the upper pads 312. The third through holes TH3 may define areas in which the second vias 320 are to be formed.

Figure 18:
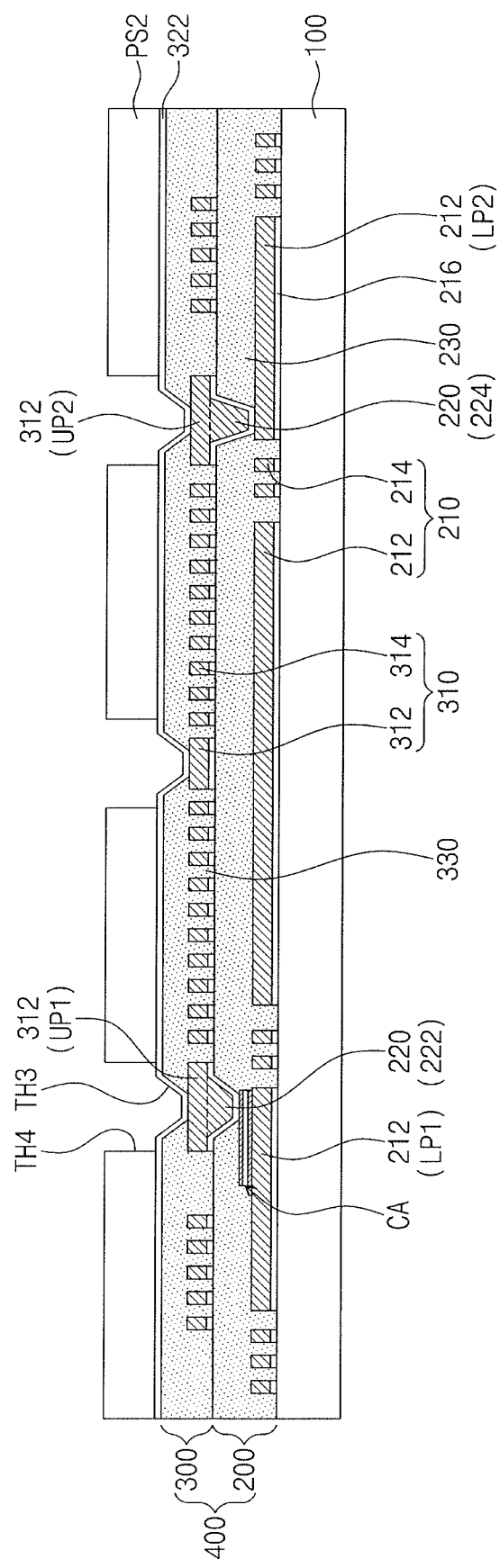

Referring to FIG. 18, the third seed layer 322 may be formed on the second insulating layer 330. The third seed layer 322 may be formed along a top surface of the second insulating layer 330 and along bottom surfaces and inner lateral surfaces of the third through holes TH3.

A second photosensitive layer PS2 may be formed on the second insulating layer 330. The second photosensitive layer PS2 may be a mask pattern for forming the second vias 320 and the under-bump pads 340 which will be discussed below. For example, the second photosensitive layer PS2 may be formed by coating a photosensitive hard mask material on the third seed layer 322. Fourth through holes TH4 may be formed on the second photosensitive layer PS2. The fourth through holes TH4 may be formed on the third through holes TH3. For example, the fourth through holes TH4 of the second photosensitive layer PS2 may be spatially connected to the third through holes TH3 of the second insulating layer 330. The fourth through holes TH4 may expose a top surface of the third seed layer 322. The fourth through holes TH4 may define areas in which are formed under-bump pads 340 which will be discussed below. Each of the fourth through holes TH4 may have a planar shape the same as or larger than that of each of the third through holes TH3.

Figure 19:
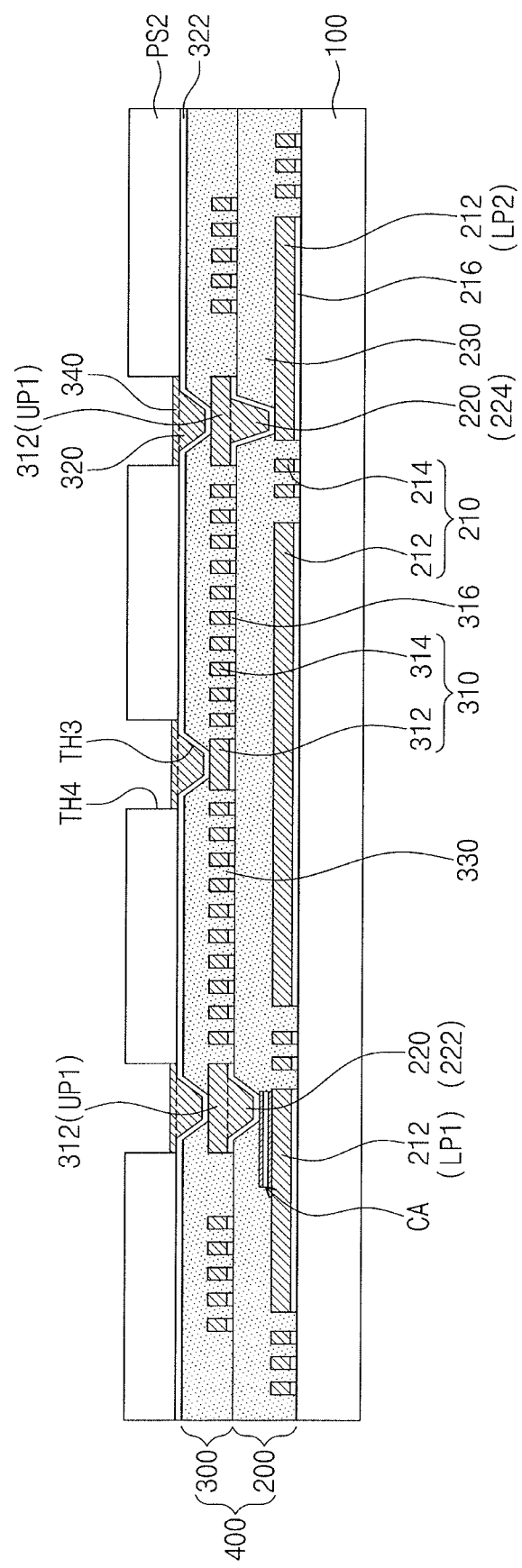

Referring to FIG. 19, the second vias 320 and the under-bump pads 340 may be formed on the upper pads 312. The second vias 320 may be formed by filling the third through holes TH3 with a conductive material. For example, the third seed layer 322 exposed to the third through holes TH3 may be used as a seed to perform a plating process that fills the third through holes TH3 with the conductive material. Based on shapes of the third through holes TH3, each of the second vias 320 may be formed to have a tapered shape whose width increases with increasing distance from the second conductive pattern 310. The under-bump pads 340 may be formed by filling the fourth through holes TH4 with a conductive material. For example, the second vias 320 exposed to the fourth through holes TH4 may be used as a seed to perform a plating process that fills the fourth through holes TH4 with the conductive material. Although the formation of the second vias 320 and the formation of the under-bump pads 340 are described separately from each other, the formation of the second vias 320 and the formation of the under-bump pads 340 may be successively performed to form the second vias 320 and the under-bump pads 340 integrally with each other. In other embodiments, after the second vias 320 are formed, a separate process may be performed to form the under-bump pads 340. Through the processes above, a second connection line layer 300 may be formed on the first connection line layer 200. After that, the second photosensitive layer PS2 may be removed to complete the redistribution substrate 400.

Referring back to FIG. 1, the semiconductor chip 500 may be mounted on the redistribution substrate 400. For example, the semiconductor chip 500 may be flip-chip bonded to the under-bump pads 340 of the redistribution substrate 400.

The molding layer 600 may be formed on the redistribution substrate 400. For example, the redistribution substrate 400 may be provided thereon with a dielectric material to cover the semiconductor chip 500. The processes above may fabricate a semiconductor package 10 of FIG. 1.

In other embodiments, a process may further be performed to form external terminals on the semiconductor package 10 of FIG. 1. Referring to FIG. 6, the support substrate 100 may be removed to expose a bottom surface of the redistribution substrate 400. The passivation layer 800 may be formed below the redistribution substrate 400. For example, the redistribution substrate 400 may be provided on its bottom surface with an organic material, an inorganic material, an ajinomoto build-up film (ABF), or an inorganic material, e.g., an epoxy-based polymer, which may result in the formation of the passivation layer 800. Thereafter, grooves exposing the lower pads 212 may be formed in the passivation layer 800, and then filled with a conductive material to form barrier metal layers 820 and external pads 810. The external pads 810 may be provided thereon with external terminals 830, e.g., solder balls or solder bumps, which may result in the completion of the semiconductor package 13 shown in FIG. 6.

Figure 20:
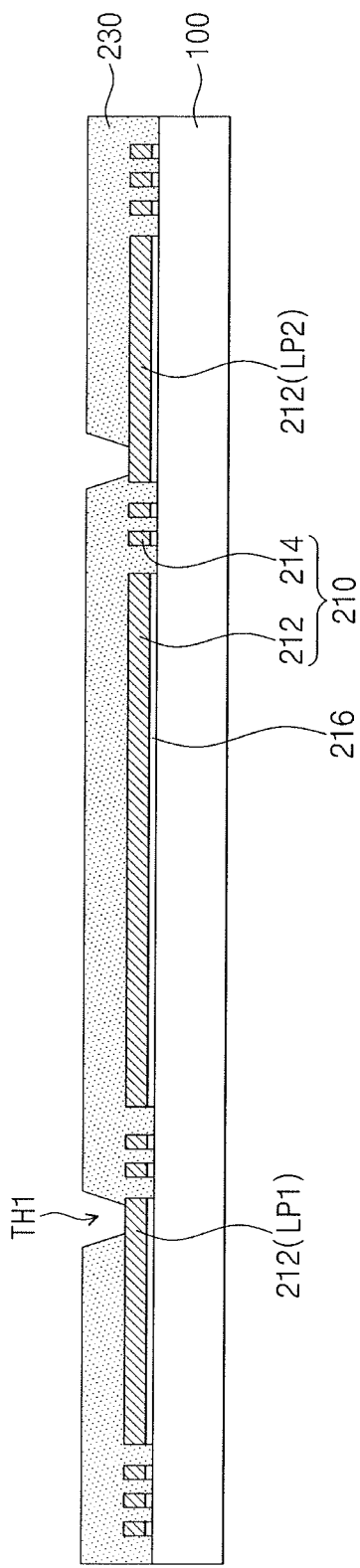
FIGS. 20 to 22 illustrate cross-sectional views of stages in a method of manufacturing a redistribution substrate according to some example embodiments.
Figure 21:
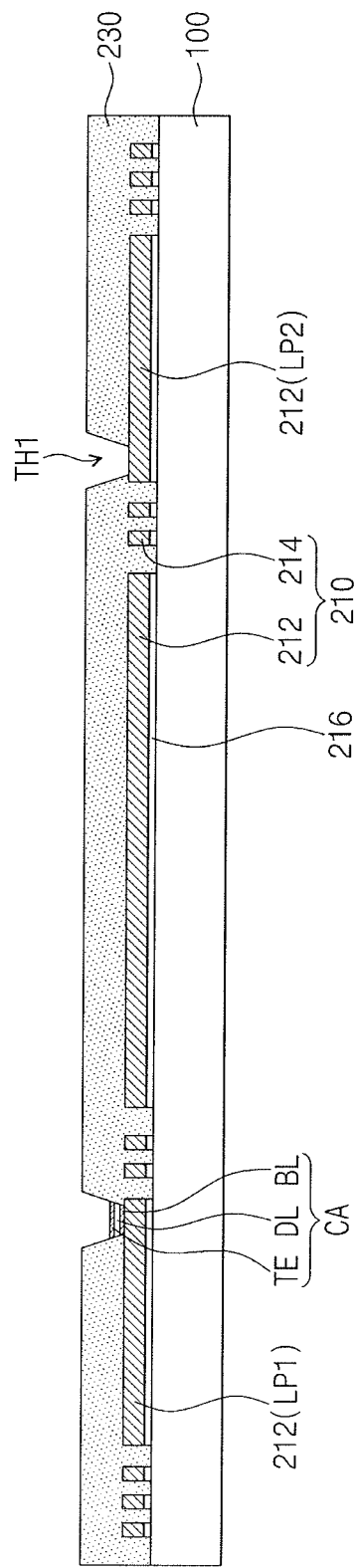
Figure 22:
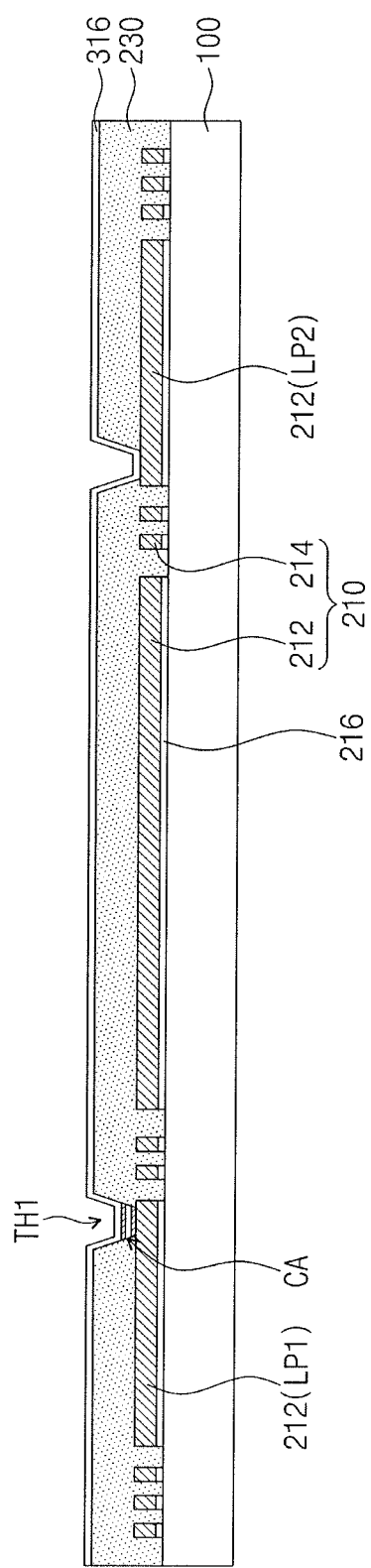

FIGS. 20 to 22 illustrate cross-sectional views of stages in a method of manufacturing a redistribution substrate according to some example embodiments.

Referring to FIG. 20, the first insulating layer 230 may be formed on a resultant structure of FIG. 7. For example, the support substrate 100 and the first conductive pattern 210 may be coated or deposited with an encapsulating material to form the first insulating layer 230. The first insulating layer 230 may be formed using, e.g., PECVD (plasma enhanced CVD), HDPCVD (high density plasma CVD), APCVD (atmospheric pressure CVD), spin coating, or the like. The first insulating layer 230 may encapsulate the first conductive pattern 210.

The first through holes TH1 may be formed on the first insulating layer 230. For example, the first insulating layer 230 may undergo an etching process to form the first through holes TH1. The etching process may over-etch an upper portion of the first insulating layer 230, and thus each of the first through holes TH1 may have a tapered shape whose width increases with increasing distance from the first conductive pattern 210. The first through holes TH1 may penetrate the first insulating layer 230 and may expose top surfaces of the lower pads 212.

Referring to FIG. 21, the capacitor CA may be formed in one of the first through holes TH1. For example, the barrier layer BL, the dielectric layer DL, and the top electrode TE may be sequentially deposited on a top surface of the first lower pad LP1, which top surface is exposed to the first through hole TH1. A chemical mechanical deposition (CVD) process may be used to form the barrier layer BL, the dielectric layer DL, and the top electrode TE. The capacitor CA may fill a lower portion of one of the first through holes TH1 that is positioned on the first lower pad LP1. The capacitor CA may be formed as discussed above.

Referring to FIG. 22, the second seed layer 316 may be formed on the first insulating layer 230. The second seed layer 316 may be formed along a top surface of the first insulating layer 230 and along bottom surfaces and inner lateral surfaces of the first through holes TH1. On the first lower pad LP1, the second seed layer 316 may contact a top surface of the capacitor CA, and on the second lower pad LP2, the second seed layer 316 may contact a top surface of the second lower pad LP2. After that, processes the same as those discussed with reference to FIGS. 16 to 19 may be performed to form the redistribution substrate 400 discussed in FIGS. 3 and 4.

By way of summation and review, a size of a semiconductor chip becomes smaller with high integration of the semiconductor chip. However, the scaling down of the semiconductor chip may lead to a difficulty in forming a desirable number of connection lines. While attempts were made to use a fan-out package, i.e., interconnections made through RDL (re-distribution layer) rather than PCB, to increase the number of connection lines, the method used to form capacitors in the re-distribution layer was complex and caused increased package size and deterioration in operating characteristics.

In contrast, according to example embodiments, a compact-sized redistribution substrate and a semiconductor package including the same are used to form a wafer level package and a panel level package, respectively, thereby providing a redistribution substrate with improved reliability and a semiconductor package including the same. That is, according to some example embodiments, a capacitor may be provided within a redistribution substrate by utilizing the redistribution process instead of the land-side capacitor (LSC) scheme. Thus, the redistribution substrate may not need a space in which the capacitor is disposed, e.g., no need to remove a ball from a lower portion of the redistribution layer, thereby increasing the compactness of the redistribution substrate and a semiconductor package including the same. Moreover, the capacitor may include a barrier layer that prevents a dielectric layer from damages caused by metal diffusion from a first conductive pattern serving as an electrode of the capacitor, thereby improving reliability of the redistribution substrate and the semiconductor package including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a redistribution substrate, the method comprising:
   forming a first conductive pattern on a substrate;
   sequentially stacking a barrier layer, a dielectric layer, and a top electrode on the first conductive pattern to form a capacitor directly contacting the first conductive pattern, a width of the capacitor being smaller than a width of the first conductive pattern;
   forming a first insulating layer covering the first conductive pattern and the capacitor, the first insulating layer having a first through hole that exposes a top surface of the capacitor; and
   forming a first via and a second conductive pattern on the first insulating layer,
   wherein the first via is formed in the first through hole and is connected to the capacitor, and
   wherein a thickness of the capacitor is less than a thickness of the first conductive pattern along a direction perpendicular to a bottom of the capacitor.

2. The method as claimed in claim 1, wherein forming the capacitor includes:
   forming on the first conductive pattern a first mask pattern that has a first recess exposing the first conductive pattern;
   sequentially depositing the barrier layer, the dielectric layer, and the top electrode in the first recess; and
   removing the first mask pattern.

3. The method as claimed in claim 2, wherein a width of the first recess is less than a width of the first conductive pattern and greater than a width of the first via.

4. The method as claimed in claim 2, wherein:
   the first through hole has a tapered shape whose width increases with increasing distance from the capacitor, and
   at an interface between the first via and the capacitor, a width of the first recess is greater than a width of the first through hole.

5. The method as claimed in claim 2, wherein the first mask pattern includes a photoresist or a metal mask.

6. The method as claimed in claim 2, wherein:
   the first mask pattern covers a top surface of the first conductive pattern and is spaced apart from the substrate, and
   an empty gap is provided surrounded by the first mask pattern, the substrate, and a lateral surface of the first conductive pattern.

7. The method as claimed in claim 1, wherein forming the capacitor includes:
   sequentially depositing a barrier material layer, a dielectric material layer, and a top electrode layer that cover the first conductive pattern; and
   patterning the barrier material layer, the dielectric material layer, and the top electrode layer to cause the barrier material layer, the dielectric material layer, and the top electrode layer to remain on a top surface of the first conductive pattern.

8. The method as claimed in claim 1, wherein forming the first via and the second conductive pattern includes:
   forming a seed layer that covers the first insulating layer and covers a bottom surface and an inner wall of the first through hole;
   forming on the first insulating layer a second mask pattern that has a second recess exposing the first through hole; and
   using the seed layer as a seed to fill the second recess with a conductive material.

9. The method as claimed in claim 1, wherein the barrier layer, the dielectric layer, and the top electrode have the same width.

10. The method as claimed in claim 1, further comprising:
    forming a second insulating layer covering the second conductive pattern;
    etching the second insulating layer to form a second through hole that exposes the second conductive pattern; and
    forming a second via that fills the second through hole and an under-bump pad that lies on the second via.

11. The method as claimed in claim 1, wherein each of the barrier layer, the dielectric layer, and the top electrode has a lateral surface in contact with the first insulating layer.

12. The method as claimed in claim 1, wherein:
    the first conductive pattern further includes a first lower pad, a second lower pad, and a plurality of lower connection lines that are spaced apart from the first lower pad and the second lower pad,
    the second conductive pattern further includes a first upper pad, a second upper pad, and a plurality of upper connection lines that are spaced apart from the first upper pad and the second upper pad, and
    the first via on the first lower pad connects the capacitor to the second conductive pattern.

13. A method of manufacturing a redistribution substrate, the method comprising:
    forming a first conductive pattern;
    forming on the first conductive pattern a first insulating layer that has a first recess exposing the first conductive pattern;
    sequentially depositing in the first recess a barrier layer, a dielectric layer, and a top electrode to form a capacitor that fills a lower portion of the first recess; and
    forming a first via and a second conductive pattern on the first insulating layer,
    wherein the first via is formed to fill a remaining portion of the first recess and to have connection with the capacitor.

14. The method as claimed in claim 13, wherein a width of the first recess is less than a width of the first conductive pattern.

15. The method as claimed in claim 13, wherein forming the first via and the second conductive pattern includes:
    forming a seed layer that covers the first insulating layer, a top surface of the capacitor, and an inner wall of the first recess;
    forming on the first insulating layer a second mask pattern that has a second recess exposing the first recess; and
    using the seed layer as a seed to fill the second recess with a conductive material.

16. The method as claimed in claim 13, wherein a lateral surface of the first via and a lateral surface of the capacitor are coplanar with each other.

17. The method as claimed in claim 13, wherein:
    the first recess has a tapered shape whose width increases with increasing distance from the first conductive pattern, and
    at an interface between the first via and the capacitor, a width of the first via and a width of the capacitor are the same.

18. The method as claimed in claim 13, wherein:
    the capacitor has a tapered shape whose width decreases with increasing distance from the second conductive pattern, and a width of the top electrode is greater than a width of the dielectric layer, and the width of the dielectric layer is greater than a width of the barrier layer.

19. The method as claimed in claim 13, further comprising:
   forming a second insulating layer covering the second conductive pattern;
   etching the second insulating layer to form a through hole that exposes the second conductive pattern; and
   forming a second via that fills the through hole and an under-bump pad that lies on the second via.

20. The method as claimed in claim 13, wherein each of the barrier layer, the dielectric layer, and the top electrode has a lateral surface in contact with the first insulating layer.

\* \* \* \* \*